(12) United States Patent
Borschert et al.

(10) Patent No.: US 6,688,817 B2
(45) Date of Patent: Feb. 10, 2004

(54) DRILL FOR DRILLING, A METHOD FOR MAKING A DRILL FOR DRILLING, AND A CUTTING TOOL

(75) Inventors: Bernhard Walter Borschert, Nürnberg (DE); Dieter Hermann Mühlfriedel, Ebermannstadt (DE); Karl-Heinz Wendt, Ebermannstadt (DE)

(73) Assignee: Kennametal Inc., Latrobe, PA (US)

( * ) Notice: Subject to any disclaimer, the term of this patent is extended or adjusted under 35 U.S.C. 154(b) by 71 days.

(21) Appl. No.: 09/927,921

(22) Filed: Aug. 10, 2001

(65) Prior Publication Data
US 2002/0046629 A1 Apr. 25, 2002

Related U.S. Application Data

(63) Continuation-in-part of application No. PCT/IB00/00122, filed on Feb. 7, 2000.

(30) Foreign Application Priority Data
Feb. 11, 1999 (DE) .......................... 199 05 735

(51) Int. Cl.⁷ ............................................... B23B 51/02
(52) U.S. Cl. .................... 408/230; 408/144; 76/108.6; 451/48
(58) Field of Search .................. 407/118; 408/144, 408/145, 230, 226, 222; 76/108.1, 108.6, 115; 451/48

(56) References Cited

U.S. PATENT DOCUMENTS

| | | | |
|---|---|---|---|
| 4,643,620 A | | 2/1987 | Fujii et al. |
| 5,020,394 A | * | 6/1991 | Nakamura et al. ......... 76/108.6 |
| 5,178,497 A | * | 1/1993 | Kitabayashi et al. ........ 408/145 |
| 5,599,144 A | * | 2/1997 | Bickham et al. ............ 408/144 |
| 5,709,587 A | * | 1/1998 | Shaffer ......................... 451/38 |
| 5,716,170 A | * | 2/1998 | Kammermeier et al. .... 408/145 |
| 5,722,803 A | * | 3/1998 | Battaglia et al. ............ 407/119 |
| 6,105,467 A | * | 8/2000 | Baker ........................ 76/104.1 |

FOREIGN PATENT DOCUMENTS

| | | | | |
|---|---|---|---|---|
| DE | 77120 | | 11/1970 | |
| DE | 19731018 | | 1/1999 | |
| EP | 0812650 | | 12/1997 | |
| EP | 0707092 | | 7/1998 | |
| JP | 63016926 | | 1/1988 | |
| JP | 63251129 A | * | 10/1988 | ................. 408/144 |
| JP | 04300104 | | 10/1992 | |
| JP | 406206105 A | * | 7/1994 | ................. 407/118 |
| WO | 9630148 | | 10/1996 | |

OTHER PUBLICATIONS

"The Influence of Substrate Processing on Wear Characteristics of Coated Carbide Tools," by Prof. Dr.–Ing. H.K. tonshoff, Dipl. –Ing. A. Mohlfeld and Dipl. Phys. H. Seegers, (no translation).

* cited by examiner

*Primary Examiner*—Daniel W. Howell
(74) *Attorney, Agent, or Firm*—Nils H. Ljungman & Associates

(57) ABSTRACT

A method of making a drill comprising a tip (16), a shank (10) and a flute area having chip spaces (12, 14) formed therein, the drill being substantially completely coated with a hard material, and is characterized by applying an abrasive material to merely the tip (16) before coating the drill with the hard material. The drill may more particularly be a solid carbide drill.

20 Claims, 4 Drawing Sheets

$$Ra = \frac{1}{l_m} \int_{x-o}^{x \cdot l_m} |y| dx$$

$$\sum Aoi - \sum Aui$$

$$Ag - \sum Aoi = \sum Aui$$

DRILL FOR DRILLING, A METHOD FOR MAKING A DRILL FOR DRILLING, AND A CUTTING TOOL

CONTINUING APPLICATION DATA

This application is a Continuation-in-part of International Application No. PCT/IB00/00122, filed on Feb. 7, 2000 and claiming priority from Federal Republic of Germany Application No. 199 05 735.4, filed on Feb. 11, 1999. International Application No. PCT/IB00/00122 was pending as of the filing date of this application. The United States was an elected state in International Application No. PCT/IB00/00122.

BACKGROUND OF THE INVENTION

1. Field of the Invention

The invention relates to a method of making a drill comprising a tip, a shank and a flute area having chip spaces formed therein, the drill being substantially completely coated with a hard material. The invention further relates to a drill which can be made by using such a method.

The invention relates to a method of making a cutting tool comprising a body portion and a cutting portion, the cutting tool being substantially completely coated with a hard material. The invention further relates to a cutting tool which can be made by using such a method.

2. Background Information

The drill may for example be a twist drill or a tapping drill, with at least one cutting area adjacent the drill tip and at least one chip flute for the removal of chips generated by the cutting of an object.

This cutting tool may for example be a milling cutter, a reamer, a drill or a tapping drill. In the following description reference is made to a drill, more particularly a solid carbide drill.

A drill is often coated with a hard material so as to increase tool life. For this purpose, the coating is applied to the entire cutting edge area of the drill, i.e. to the drill tip and the chip space area of the tool. The hard material coating will then result in the desired wear resistance of the drill.

In addition to the wear resistance of the drill, it is also relevant for its performance how well the chips formed by the cutting work done at the drill tip can be removed through the chip spaces. For a good chip flow, the chip spaces must be as smooth as possible. This requirement is met if the hard material coating is applied to the polished surface of the drill. In this case the coating also exhibits very low roughness, so that the desired chip flow is obtained.

It has been found, however, that the hard material coating does not always adhere to the drill to the extent as desired if the polished surface of the drill is coated directly. However, it has been possible to obtain a distinct improvement in adhesion by microblasting the polished surface of the drill before coating. The microblasting leads to a slight plastic deformation of the border zone of the drill, which increases the internal compressive stresses. At the same time microblasting causes a distinct reduction in the internal stress gradient in the border zone of the drill processed in this manner. Another effect is that the microtopography is heavily changed. This change provides for that a subsequently applied carbide coating shows an improved adhesion to the surface of the drill. This results in the hard material coating exhibiting improved wear characteristics (see article "Einfluß der Substratbearbeitung auf das Verschleißverhalten von beschichteten Hartmetallwerkzeugen" [title translation: "The influence of substrate processing on wear characteristics of coated carbide tools"] by Prof. Dr.-Ing. H. K. Tonshoff, Dipl.-Ing. A. Mohlfeld and Dipl. Phys. H. Seegers, institute for product engineering and cutting machine tools at the University of Hanover, Germany).

However, a disadvantage resides in that the microblasted surface has an increased roughness, so that the coated surface, too, has a roughness greater than that in the case of drills where the hard material coating is applied directly to the polished surface. The consequence is thus a higher coefficient of friction, resulting in poorer chip flow in the chip spaces.

OBJECT AND SUMMARY OF THE INVENTION

The present invention overcomes this disadvantage by microblasting merely the tip before coating the cutting tool, for example a drill, with the hard material. In this way, good adhesiveness of the coating in the areas where required may be combined with a smooth surface of the tool and, thus, good chip flow in those areas where this is required. The entire cutting work is performed in the area of the tip, so that proper adhesiveness of the coating at this location is of major importance. Chip flow is of subordinate significance in the area of the tip. In the area of the chip spaces, on the other hand, the stresses occurring are much lower than at the tip, so that at this location the adhesiveness of the hard material coating on the surface which has not been subjected to this finishing treatment is sufficient. In the area of the chip spaces, however, a low coefficient of friction is of particular importance, which is ensured by applying the coating to the tool surface which is not microblasted and is therefore smooth, with the result that the desired low coefficient of friction is obtained.

Advantageous further developments of the invention will be apparent from the features of the invention discussed below.

The above-discussed embodiments of the present invention will be described further hereinbelow. When the word "invention" is used in this specification, the word "invention" includes "inventions", that is the plural of "invention". By stating "invention", the Applicant does not in any way admit that the present application does not include more than one patentably and non-obviously distinct invention, and maintains that this application may include more than one patentably and non-obviously distinct invention. The Applicant hereby asserts that the disclosure of this application may include more than one invention, and, in the event that there is more than one invention, that these inventions may be patentable and non-obvious one with respect to the other.

BRIEF DESCRIPTION OF THE DRAWINGS

The invention will be described below with reference to the accompanying figures.

DESCRIPTION OF THE PREFERRED EMBODIMENT

Figure 1:
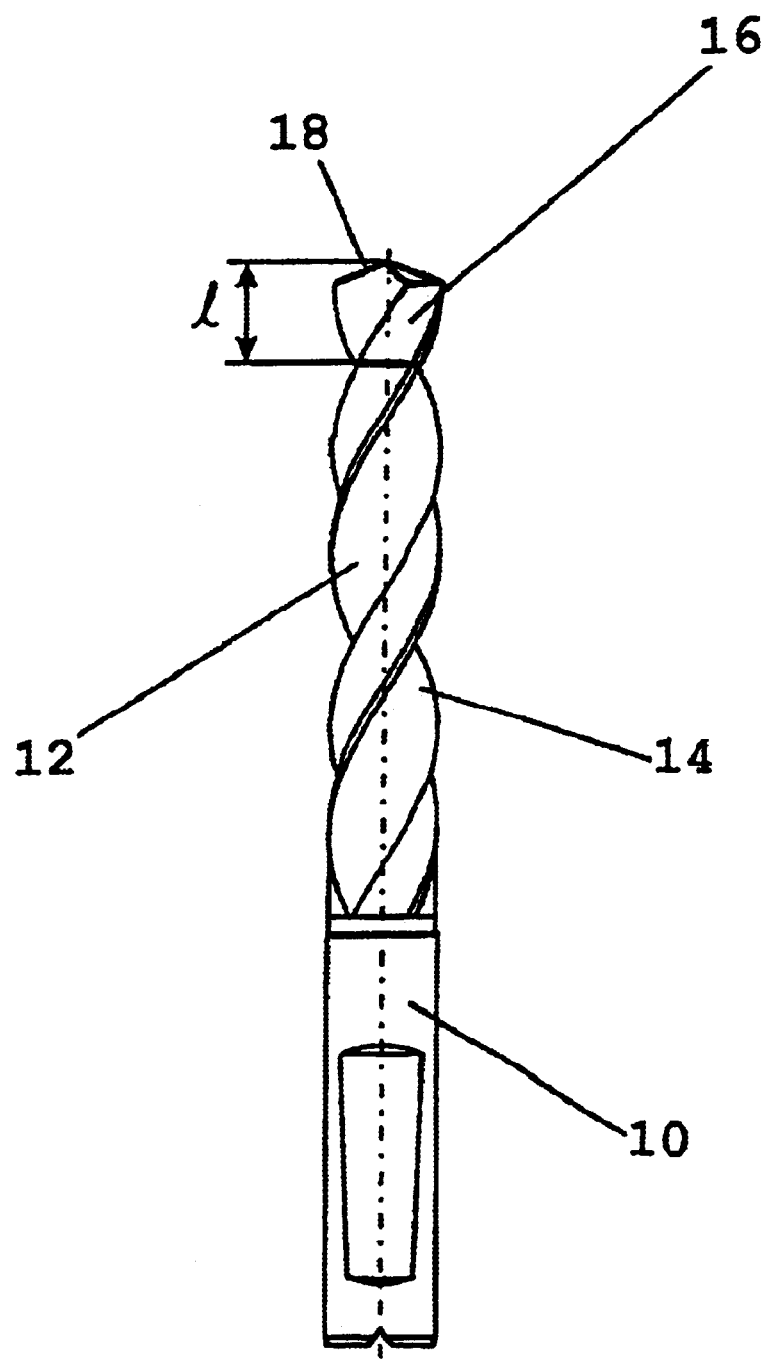
FIG. 1, shows a cutting tool, specifically a drill, in accordance with the invention.

According to one possible embodiment of the invention, the object of the invention may be accomplished in a drill for drilling, which drill has a shank that is designed to be mounted in a chuck mechanism to drive the drill. The drill also has a drill body and a tip. The drill body is disposed between the shank and the tip and has at least one chip flute which extends longitudinally along the length of the drill body. The tip has at least one cutting edge designed to cut into an object to be drilled. The chip flute is designed to guide chips produced by cutting of the object with the cutting edge. The drill body has a first section adjacent the tip and a second section adjacent the shank. Each of the first section, the second section, and the tip have at least one surface. The surface of the tip has a first roughness, the surface of the first section has a second roughness, and the surface of the second section has a third roughness. The first roughness and the second roughness are greater than the third roughness. Each of the surface of the tip, the surface of the first section, and the surface of the second section are coated with a hard material which is harder than the drill body.

The drill has a length dimension from the tip to the shank. The drill also has a diameter dimension which is transverse to the length dimension. The tip and the first section together cover an area of the drill which is substantially twice the diameter dimension in length. The drill can also be a solid carbide drill.

According to another possible embodiment of the invention, at least one of the first roughness and the second roughness is greater than the third roughness. According to yet another possible embodiment of the present invention, at least one of the surface of the tip and the surface of the first section is coated with a hard material which is harder than the drill body.

According to yet another possible embodiment of the present invention, the averaged roughness depths are according to German Industrial Standard (DIN) 4768. An English translation of DIN 4768 is presented herein in its entirety as follows. "DIN 4768 Determination of Surface Roughness of Parameters $R_a$, $R_z$, and $R_{max}$ by means of Electrical Stylus Instruments—Definitions, measurement requirements (May 1990)

The previous editions of this standard also contained findings by means of two-stage RC filters, although such filters are no longer used in modern measurement devices. The current phase-correction filters can also be used for measurements of waviness. Therefore they were omitted from the subsequent edition of DIN 4768 and are described in a separate standard DIN 4777. The two standards can be properly understood only by reading them in a close relationship with each other.

This standard is valid for the determination of comparable roughness measurements of industrial surfaces with electric stylus instruments with electrical transmission, high-pass filtering and evaluation capabilities. Waviness and shape variances are not the subject of this standard.

DIN 4768 gives definitions and measurement principles for the average roughness $R_a$, the averaged roughness depth $R_z$ and the maximum roughness depth $R_{max}$. The publication of this standard achieves the following advantages over the previous situation:

1. The influence of the outliers on the measurement result is reduced by the determination of the arithmetic mean of the individual roughness depths of five adjacent individual measured sections. The elimination of the outliers thereby becomes a more objective process.
2. If the maximum depth of roughness $R_{max}$ (i.e. the greatest outlier) is required for functional reasons, it must be measured under the same conditions as the averaged depth of roughness $R_z$.
3. The selection of the boundary wavelength of the wave filter must be defined for periodic profiles (turning, planing etc.) by associations with the interval between grooves and on aperiodic profiles (grinding, contour milling etc.) by associations with the expected $R_z$ value.
4. In addition to $R_z$ and $R_{max}$ the measurement conditions for the arithmetic mean roughness $R_a$ are also defined.

Definitions:

Definition of boundary wavelength $\lambda_e$ —see DIN 4777

Measurement Requirements

Basically, scanning must be conducted in the direction in which the greatest roughness value is measured. If another direction must be used for operational reasons, the scanning direction must be indicated. On periodic profiles (e.g. lathe turning, planing), the classifications indicated in Table 285.1 apply.

On aperiodic profiles (e.g. grinding, lapping, contour milling, reaming), for the measurement of $R_a$ the classifications in Table 285.2 apply. For the measurement of $R_{max}$ on aperiodic profiles, the boundary wavelength is governed by $R_z$. The total measured length is generally five times the length of the boundary wavelength. However, if the workpiece does not permit the total measured length of 5 $\lambda_e$, a total measured length of $\lambda_e$ can be used. This must be indicated with the roughness value, e.g. $R_a 1.1$=m at $I_m$=3 $\lambda_e$. If, for special reasons, classifications of the boundary wavelength other than those indicated in Tables 285.1 to 285.3 are necessary, the wavelengths must be indicated with the roughness values, e.g. $R_a$ 1.1=m at $I_m$=0.25 mm. The boundary wavelengths and the individual measured distances must always be of equal length.

TABLE 285.1

Classification by distance between grooves

| Distance between grooves (Feed) in mm | $\lambda_e$ in mm | $l_e$ in mm | $l_m$ min. in mm |
|---|---|---|---|
| more than 0.01 to 0.04 | 0.08 | 0.08 | 0.4 |
| more than 0.032 to 0.13 | 0.25 | 0.25 | 1.25 |
| more than 0.1 to 0.4 | 0.8 | 0.8 | 4 |
| more than 0.32 to 1.3 | 2.5 | 2.5 | 12.5 |
| more than 1 to 4 | 8 | 8 | 40 |

Definition of boundary wavelength $\lambda_e$ —See DIN 4777

TABLE 285.2

Classification by averaged depth of roughness $R_z$

| $R_z$ in m | $\lambda_e$ in mm | $l_e$ in mm | $l_m$ min. in mm |
|---|---|---|---|
| Up to 0.01 | 0.08 | 0.08 | 0.4 |
| more than 0.01 to 0.5 | 0.25 | 0.25 | 1.25 |
| more than 0.5 to 10 | 0.8 | 0.8 | 4 |
| more than 0.32 to 50 | 2.5 | 2.5 | 12.5 |
| more than 50 | 8 | 8 | 40 |

TABLE 285.3

Classification by mean roughness $R_a$

| $R_a$ in m | $\lambda_e$ in mm | $l_m$ min. in mm |
|---|---|---|
| Up to 0.02 | 0.08 | 0.4 |
| more than 0.02 to 0.1 | 0.25 | 1.25 |
| more than 0.1 to 2 | 0.8 | 4 |
| more than 2 to 10 | 2.5 | 12.5 |
| more than 10 | 8 | 40 |

Appendix to DIN 4768-1 Determination of Surface Roughness of Parameters $R_a$, $R_z$, and $R_{max}$ by means of Electrical Stylus Instruments —Conversion of the measurements $R_a$ to $R_z$ and vice-versa (October 1978)

This Appendix is intended to facilitate the interpretation of the results between plants in which the roughness of the workpiece surface is evaluated on the basis of the averaged depth of roughness $R_z$ and plants that prefer to use the mean roughness $R_a$.

If, for the determination of the upper limit of the $R_z$ value with a specified $R_a$ value, the upper boundary line of the range of dispersion is selected, it can be assumed that the specified $R_z$ value is not exceeded. The same is true for the specified $R_z$ value, if the bottom line is used for the determination of the $R_a$ boundary value. With this conversion rule, the results will in any case be "on the safe side", although the result will very frequently be a roughness measurement that is converted with excessive precision, as a result of which the manufacturing may become excessively expensive. Therefore, weighing the risks of error, consideration should be given to whether an orientation toward the middle of the range of dispersion is not better for the conversion. However, this possibility is not taken into consideration in this Appendix."

According to one other possible embodiment of the invention, the object of the invention may be accomplished in a method for making a drill, such as the drill described above. The method has the step of applying an abrasive material to at least one of: the surface of the tip and the surface of the first section, to roughen at least one of the surface of the tip and the surface of the first section.

In addition, the abrasive material has an average grain size of between approximately five micrometers and fifty micrometers.

The method further has the step of coating at least one of: the surface of the tip and the surface of the first section, with the hard material which is harder than the drill body.

According to another possible embodiment of the invention, the object of the invention may be accomplished in a cutting tool, such as a drill, a tapping drill, a milling cutter, or a reamer, for cutting. The cutting tool has a driven portion designed to be mounted on or in a holding mechanism to drive the cutting tool. The cutting tool has a tool body portion and a cutting portion, which tool body portion is disposed between the driven portion and the cutting portion. The cutting portion has at least one cutting edge designed to cut into an object to be drilled. The tool body portion has a first section disposed adjacent the cutting portion and a second section disposed adjacent the driven portion. The first section, the second section, and the cutting portion each has at least one surface. The surface of the cutting portion has a first roughness, the surface of the first section has a second roughness, and the surface of the second section has a third roughness. At least one of the first roughness and the second roughness is greater than the third roughness.

As an example of a cutting tool in accordance with the invention a drill will now be described. The method according to the invention and the structure of the tool according to the invention may however be applied to any other cutting tools as desired, for example milling cutters, reamers, tapping drills and the like.

The drill comprises a shank 10 and a flute area having two chip spaces 12, 14 formed therein. At the front end a drill tip 16 is formed which covers the area of the main cutting edge 18 of the drill and, starting from the chisel edge of the drill, an area having a length of approximately twice the diameter of the drill.

The drill is a solid carbide drill. It thus comprises a binding metal as substrate, for example, cobalt, nickel and/or iron, with a hard material bound therein, for example, tungsten carbide, titanium carbide, tantalum carbide and/or boron nitride.

The drill has a polished surface in the area of the chip spaces 12, 14 and in the area of the drill tip 16. At first, this drill is cleaned and dried. The drill tip 16 is subsequently microblasted. The material preferably used therefor is corundum 500 (average grain size of between 5 and 50 $\mu$m) at a jet pressure of from 0.5 to 5 bars. The drill tip is blasted until a uniformly matt surface is obtained. The drill is then cleaned using a method as known in the art.

Finally, at least the cutting edge area of the drill, i.e. the area of the chip spaces 12, 14 and the drill tip 16, is provided with a hard material physical vapor deposition (PVD) coating. Basically, any hard material can be used which, firstly, can be applied using PVD methods and, secondly, is compatible with the carbide used as substrate. Suitable materials for the hard material coating are, for example, titanium aluminum nitride, titanium nitride, boron carbonitride or titanium carbonitride.

The microblasting results in an increase in surface roughness. Measurements at the land 20 of the drill have shown a roughness $R_z$ in accordance with DIN 4768 and DIN 4768 T1 (German Industrial Standards) of between 0.7 and 0.8 $\mu$m in the areas which had not been microblasted. In the area of the microblasted drill tip 16 the result was a roughness $R_z$ of between 0.9 and 1.0 $\mu$m at the land 20. These values are the same both before and after coating the drill with the hard material PVD coating.

To further explain, the microblasting produces an increased surface roughness in the microblasted areas. This surface roughness is determined by a measuring process according to German Industrial Standard (DIN) 4768 and DIN 4768 T1. In other words, the determination process, in general, involves detecting five consecutive individual peaks and corresponding valleys along the surface of a material. The distance from the individual peaks to the corresponding valleys is then measured. The distances are then averaged to arrive at an arithmetic mean value $R_z$ which represents average surface roughness. Through this technique, it is possible to determine, in at least one embodiment of the present invention, a surface roughness of between 0.7 and 0.8 $\mu$m for the surfaces of the drill that are not microblasted. It is further possible to determine a surface roughness of between 0.9 and 1.0 $\mu$m for the surfaces of the drill that are microblasted. These values are the same both before and after coating the drill with the hard material PVD coating.

One feature of the invention resides broadly in a method of making a cutting tool comprising a tip (16), a shank (10) and a flute area having chip spaces (12, 14) formed therein, the cutting tool being substantially completely coated with a hard material, characterized by microblasting merely the tip (16) before coating the cutting tool with the hard material.

Another feature of the invention resides broadly in a method characterized in that the step of microblasting the tip (16) covers an area of approximately twice the diameter of the cutting tool, starting from the front end of the cutting tool.

Yet another feature of the invention resides broadly in a method characterized in that the coating of the cutting tool is performed as a PVD coating.

Still another feature of the invention resides broadly in a method characterized in that $Al_2O_3$ having an average grain size of between about 5 µm and 50 µm is used as the blasting medium for the microblasting.

A further feature of the invention resides broadly in a cutting tool comprising a tip (16), a shank (10) and a flute area having chip spaces (12, 14) formed therein, the tip (16) being microblasted and the cutting tool being substantially completely coated with a hard material.

Another feature of the invention resides broadly in a cutting tool characterized in that it is a solid carbide tool.

Yet another feature of the invention resides broadly in a cutting tool characterized in that cobalt, nickel and/or iron is used as binding metal and tungsten carbide, titanium carbide, tantalum carbide and/or boron nitride is used as hard material bound therein.

Still another feature of the invention resides broadly in a cutting tool characterized in that its surface in the non-microblasted areas is by at least $R_z$ 0.2 µm finer than in microblasted areas.

A further feature of the invention resides broadly in a cutting tool characterized in that it has a roughness $R_z$ of between 0.7 and 0.8 µm in the non-microblasted areas and a roughness $R_z$ of between 0.9 and 1.0 µm in the microblasted areas.

Another feature of the invention resides broadly in a cutting tool characterized in that it is a drill.

Yet another feature of the invention resides broadly in a cutting tool characterized in that it is a tapping drill.

Still another feature of the invention resides broadly in a cutting tool characterized in that it is a milling cutter.

A further feature of the invention resides broadly in a cutting tool characterized in that it is a reamer.

Another feature of the invention resides broadly in a cutting tool characterized in that the hard material used as coating is boron carbonitride, titanium carbonitride, titanium aluminum nitride and/or titanium nitride.

The components disclosed in the various publications, disclosed or incorporated by reference herein, may be used in the embodiments of the present invention, as well as equivalents thereof.

The appended drawings in their entirety, including all dimensions, proportions and/or shapes in at least one embodiment of the invention, are accurate and are hereby included by reference into this specification.

All, or substantially all, of the components and methods of the various embodiments may be used with at least one embodiment or all of the embodiments, if more than one embodiment is described herein.

All of the patents, patent applications and publications recited herein, and in the Declaration attached hereto, are hereby incorporated by reference as if set forth in their entirety herein.

The corresponding foreign and international patent publication applications, namely, Federal Republic of Germany Application No. 199 05 735.4, filed on Feb. 11, 1999, having inventors Bernhard BORSCHERT, Dieter M ÜHLFRIEDEL, and Karl-Heinz WENDT, and DE-OS 199 05 735.4, and DE-PS 199 05 735.4, and International Application No. PCT/IB00/00122, filed on Feb. 7, 2000, having inventors Bernhard BORSCHERT, Dieter M ÜHLFRIEDEL, and Karl-Heinz WENDT, as well as their published equivalents, and other equivalents or corresponding applications, if any, in corresponding cases in the Federal Republic of Germany and elsewhere, and the references and documents cited in any of the documents cited herein, such as the patents, patent applications and publications, are hereby incorporated by reference as if set forth in their entirety herein.

All of the references and documents, cited in any of the documents cited herein, are hereby incorporated by reference as if set forth in their entirety herein. All of the documents cited herein, referred to in the immediately preceding sentence, include all of the patents, patent applications and publications cited anywhere in the present application.

The details in the patents, patent applications and publications may be considered to be incorporable, at applicant's option, into the claims during prosecution as further limitations in the claims to patentably distinguish any amended claims from any applied prior art.

What is claimed is:

1. A drill for drilling, said drill comprising:

a shank;

said shank being configured to be mounted in a chuck mechanism to drive said drill;

a fluted portion;

a conical tip portion;

said fluted portion being disposed between said shank and said conical tip portion;

said fluted portion and said conical tip portion comprising one material throughout;

said fluted portion comprising at least one chip flute which extends longitudinally along the length of the flute portion;

said conical tip portion comprising at least one cutting edge;

said at least one cutting edge being configured to cut into an object to be drilled;

said at least one chip flute being configured to guide chips produced by cutting an object with said at least one cutting edge;

said fluted portion comprising a first section disposed adjacent said conical tip portion and a second section disposed adjacent said shank;

said first section, said second section, and said conical tip portion each comprising at least one surface;

said at least one surface of said conical tip portion having a plurality of pits formed in said one material to form a first surface roughness;

said at least one surface of said first section having a plurality of pits formed in said one material to form a second surface roughness;

said at least one surface of said second section having a third surface roughness;

each of said first surface roughness and said second surface roughness being greater than said third surface roughness; and each of said at least one surface of said conical tip portion, said at least one surface of said first section, and said at least one surface of said second section being coated with a material which is harder than said one material of said drill.

2. The drill according to claim 1, wherein:
each of said first surface roughness and said second surface roughness have an averaged roughness depth that is at least two-tenths of a micrometer deeper than an averaged roughness depth of said third surface roughness.

3. The drill according to claim 2, wherein:
said averaged roughness depth of said third surface roughness is between seven-tenths and eight-tenths of a micrometer; and
said averaged roughness depth of each of said first surface roughness and said second surface roughness is between nine-tenths of a micrometer and one micrometer.

4. The drill according to claim 3, wherein:
said drill has a length dimension from said conical tip portion to said shank;
said drill has a diameter dimension transverse to said length dimension; and
said conical tip portion and said first section together cover an area of said drill which is substantially twice the diameter dimension in length.

5. The drill according to claim 4, wherein:
said drill is a solid carbide drill; and
said averaged roughness depths are according to DIN 4768.

6. A drill for drilling, said drill comprising:
a shank;
said shank being configured to be mounted in a chuck mechanism to drive said drill;
a fluted portion;
a conical tip portion;
said fluted portion being disposed between said shank and said conical tip portion;
said fluted portion and said conical tip portion comprising essentially one material throughout;
said fluted portion comprising at least one chip flute which extends longitudinally along the length of the flute portion;
said conical tip portion comprising at least one cutting edge;
said at least one cutting edge being configured to cut into an object to be drilled;
said at least one chip flute being configured to guide chips produced by cutting an object with said at least one cutting edge;
said fluted portion comprising a first section disposed adjacent said conical tip portion and a second section disposed adjacent said shank;
said first section, said second section, and said conical tip portion each comprising at least one surface;
said at least one surface of said conical tip portion having a plurality of pits formed in said one material to form a first surface roughness;
said at least one surface of said first section having a plurality of pits formed in said one material to form a second surface roughness;
said at least one surface of said second section having a third surface roughness;
at least one of said first surface roughness and said second surface roughness being greater than said third surface roughness; and
each of said at least one surface of said conical tip portion, said at least one surface of said first section, and said at least one surface of said second section being coated with a material which is harder than said one material of said drill.

7. The drill according to claim 6, wherein:
said first surface roughness and said second surface roughness have the same roughness.

8. The drill according to claim 7, wherein:
said drill has a length dimension from said conical tip portion to said shank;
said drill has a diameter dimension transverse to said length dimension; and
said conical tip portion and said first section together cover an area of said drill which is substantially twice the diameter dimension in length.

9. The drill according to claim 8, wherein:
each of said first surface roughness and said second surface roughness have an averaged roughness depth that is at least two-tenths of a micrometer deeper than an averaged roughness depth of said third surface roughness;
said averaged roughness depth of said third surface roughness is between seven-tenths and eight-tenths of a micrometer;
said averaged roughness depth of each of said first surface roughness and said second surface roughness is between nine-tenths of a micrometer and one micrometer;
said averaged roughness depths are according to DIN 4768;
said drill comprises a binding metal comprising at least one of: cobalt, nickel, and iron; and
said drill comprises a material bound in said binding metal, which bound material comprises at least one of: tungsten carbide, titanium carbide, tantalum carbide, and boron nitride.

10. A method for making a drill for drilling, said drill comprising a shank; said shank being configured to be mounted in a chuck mechanism to drive said drill; a fluted portion; a conical tip portion; said fluted portion being disposed between said shank and said conical tip portion; said fluted portion and said conical tip portion comprising essentially one material throughout; said fluted portion comprising at least one chip flute which extends longitudinally along the length of the fluted portion; said conical tip portion comprising at least one cutting edge; said at least one cutting edge being configured to cut into an object to be drilled; said at least one chip flute being configured to guide chips produced by cutting an object with said at least one cutting edge; said fluted portion comprising a first section disposed adjacent said conical tip portion and a second section disposed adjacent said shank; said first section, said second section, and said conical tip portion each comprising at least one surface; said at least one surface of said conical tip portion having a first surface roughness; said at least one surface of said first section having a second surfaQe roughness; said at least one surface of said second section having a third surface roughness; each of said first surface roughness and said second surface roughness being greater than said third surface roughness, said method comprising the steps of:
projecting abrasive particles at each of:
said at least one surface of said conical tip portion, and
said at least one surface of said first section, and
thus impinging upon said each of:
said at least one surface of said conical tip portion, and said at least one surface of said first section,
with said abrasive particles, and
thus producing a plurality of pits in said each of:
said at least one surface of said conical tip portion, and
said at least one surface of said first section, and
thus forming a surface roughness on said each of:
said at least one surface of said conical tip portion, and
said at least one surface of said first section,
whereupon each of said first surface roughness and said second surface roughness is greater than said third surface roughness.

11. The method of making a drill according to claim 10, wherein:
said step of forming said surface roughness comprises forming the same surface roughness on said each of:
said at least one surface of said conical tip portion, and
said at least one surface of said first section; and
said method further comprises the step of coating each of:
said at least one surface of said conical tip portion,
said at least one surface of said first section, and
said at least one surface of said second section,
with another material which is harder than said one material of said drill.

12. The method of making a drill according to claim 11, wherein:
said step of projecting abrasive particles comprises projecting particles of $Al_2O_3$ having an average grain size of between approximately five micrometers and fifty micrometers; and
said step of coating comprises substantially completely coating each of:
said at least one surface of said conical tip portion, and
said at least one surface of said first section,
using a physical vapor deposition coating.

13. The drill made by the process according to claim 10.

14. A cutting tool for cutting, said cutting tool comprising:
a driven portion;
said driven portion being configured to be mounted on or in a mechanism to drive said cutting tool;
a tool body portion;
a cutting portion;
said tool body portion and said cutting portion comprising essentially one material throughout;
said tool body portion being disposed between said driven portion and said cutting portion;
said cutting portion comprising at least one cutting edge;
said at least one cutting edge being configured to cut into an object;
said tool body portion comprising a first section disposed adjacent said cutting portion and a second section disposed adjacent said driven portion;
said first section, said second section, and said cutting portion each comprising at least one surface;
said at least one surface of said cutting portion having a plurality of pits formed in said one material to form a first surface roughness;
said at least one surface of said first section having a plurality of pits formed in said one material to form a second surface roughness;
said at least one surface of said second section having a third surface roughness; and
at least one of said first surface roughness and said second surface roughness being greater than said third surface roughness.

15. The cutting tool according to claim 14 including at least one of (A), (B), (C), (D), (E), (F), (G), and (H), wherein (A), (B), (C), (D), (E), (F), (G), and (H), are as follows;
(A) said first surface roughness and said second surface roughness have the same roughness;
(B) each of said at least one surface of said cutting portion, said at least one surface of said first section, and said at least one surface of said second section being substantially completely coated with a material which is harder than said one material of said cutting tool;
said coating material comprises at least one of: boron carbonitride, titanium carbonitride, titanium aluminum nitride, and titanium nitride;
(C) said cutting tool has a length dimension from said cutting portion to said driven portion;
said cutting tool has a diameter dimension transverse to said length dimension; and
said cutting portion and said first section together cover an area of said cutting tool which is substantially twice the diameter dimension in length;
(D) each of said first surface roughness and said second surface roughness have an averaged roughness depth that is at least two-tenths of a micrometer deeper than an averaged roughness depth of said third surface roughness;
(E) said averaged roughness depth of said third surface roughness is between seven-tenths and eight-tenths of a micrometer;
said averaged roughness depth of each of said first surface roughness and said second surface roughness is between nine-tenths of a micrometer and one micrometer;
said averaged roughness depths are according to DIN 4768;
(F) said cutting tool comprises a binding metal comprising at least one of: cobalt, nickel, and iron;
(G) said cutting tool comprises a material bound in said binding metal, which bound material comprises at least one of: tungsten carbide, titanium carbide, tantalum carbide, and boron nitride; and
(H) said cutting tool comprises one of: a drill, a tapping drill, a milling cutter, and a reamer.

16. The cutting tool according to claim 13, including all of (A), (B), (C), (D), (E), (F), (G), and (H), wherein (A), (B), (C), (D), (E), (F), (G), and (H), are as follows:
(A) said first surface roughness and said second surface roughness have the same roughness;
(B) each of said at least one surface of said cutting portion, said at least one surface of said first section, and said at least one surface of said second section being substantially completely coated with a material which is harder than said one material of said cutting tool;
said coating material comprises at least one of: boron carbonitride, titanium carbonitride, titanium aluminum nitride, and titanium nitride;
(C) said cutting tool has a length dimension from said cutting portion to said driven portion;
said cutting tool has a diameter dimension transverse to said length dimension; and
said cutting portion and said first section together cover an area of said cutting tool which is substantially twice the diameter dimension in length;

(D) each of said first surface roughness and said second surface roughness have an averaged roughness depth that is at least two-tenths of a micrometer deeper than an averaged roughness depth of said third surface roughness;

(E) said averaged roughness depth of said third surface roughness is between seven-tenths and eight-tenths of a micrometer;

said averaged roughness depth of each of said first surface roughness and said second surface roughness is between nine-tenths of a micrometer and one micrometer;

said averaged roughness depths are according to DIN 4768;

(F) said cutting tool comprises a binding metal comprising at least one of: cobalt, nickel, and iron;

(G) said cutting tool comprises a material bound in said binding metal, which bound material comprises at least one of: tungsten carbide, titanium carbide, tantalum carbide, and boron nitride; and (H) said cutting tool comprises one of: a drill, a tapping drill, a milling cutter, and a reamer.

17. A method for making a cutting tool for cutting, said cutting tool comprising a driven portion; said driven portion being configured to be mounted on or in a mechanism to drive said cutting tool; a tool body portion; a cutting portion; said tool body portion and said cutting portion comprising essentially one material throughout;

said tool body portion being disposed between said driven portion and said cutting portion; said cutting portion comprising at least one cutting edge; said at least one cutting edge being configured to cut into an object; said tool body portion comprising a first section disposed adjacent said cutting portion and a second section disposed adjacent said driven portion; said first section, said second section, and said cutting portion each comprising at least one surface; said at least one surface of said cutting portion having a first surface roughness; said at least one surface of said first section having a second surface roughness; said at least one surface of said second section having a third surface roughness; and at least one of said first surface roughness and said second surface roughness being greater than said third surface roughness, said method comprising the steps of:

projecting abrasive particles at at least one of:
said at least one surface of said cutting portion, and
said at least one surface of said first section, and thus impinging upon said at least one of:
said at least one surface of said cutting portion, and said at least one surface of said first section,
with said abrasive particles, and thus producing a plurality of pits in said at least one of:
said at least one surface of said cutting portion, and
said at least one surface of said first section, and thus forming a surface roughness on said at least one of:
said at least one surface of said cutting portion, and
said at least one surface of said first section,
whereupon at least one of said first surface roughness and said second surface roughness is greater than said third surface roughness.

18. The method of making a cutting tool according to claim 17, wherein said method further comprises the step of coating each of:
said at least one surface of said cutting portion,
said at least one surface of said first section, and
said at least one surface of said second section,
with another material which is harder then said one material of said cutting tool.

19. The method of making a cutting tool according to claim 18, wherein:
said step of projecting abrasive particles comprises projecting particles of $Al_2O_3$ having an average grain size of between approximately five micrometers and fifty micrometers; and
said step of coating comprises substantially completely coating each of:
said at least one surface of said cutting portion, and
said at least one surface of said first section,
using a physical vapor deposition coating.

20. The cutting tool made by the process according to claim 17.

* * * * *

UNITED STATES PATENT AND TRADEMARK OFFICE
CERTIFICATE OF CORRECTION

Figure 2:
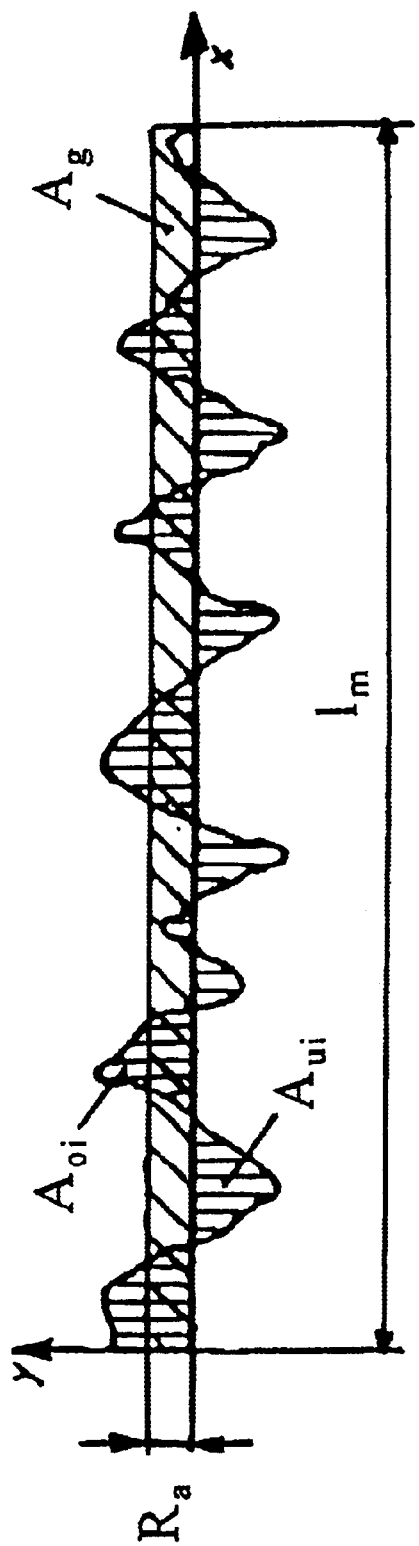
FIG. 2 shows a graph to determine Arithmetic Mean Roughness $R_a$, in accordance with German Industrial Standard (DIN) 4768.

PATENT NO. : 6,688,817 B2
DATED : February 10, 2004
INVENTOR(S) : Bernhard Walter Borschert, Dieter Hermann Mühlfriedel and Karl-Heinz Wendt It is certified that error appears in the above-identified patent and that said Letters Patent is hereby corrected as shown below:

Column 4,
Line 18, after "Definitions:", insert the following paragraphs:
-- Arithmetic mean roughness $R_a$. Arithmetic mean of the absolute values of the distances y of the roughness profile from the center line inside the measured section. This is equivalent to the height of a rectangle, the length of which is equal to the total measured section and which covers the same area as the sum of the surfaces between the roughness profile and the center line (See Figure 2).

Figure 3:
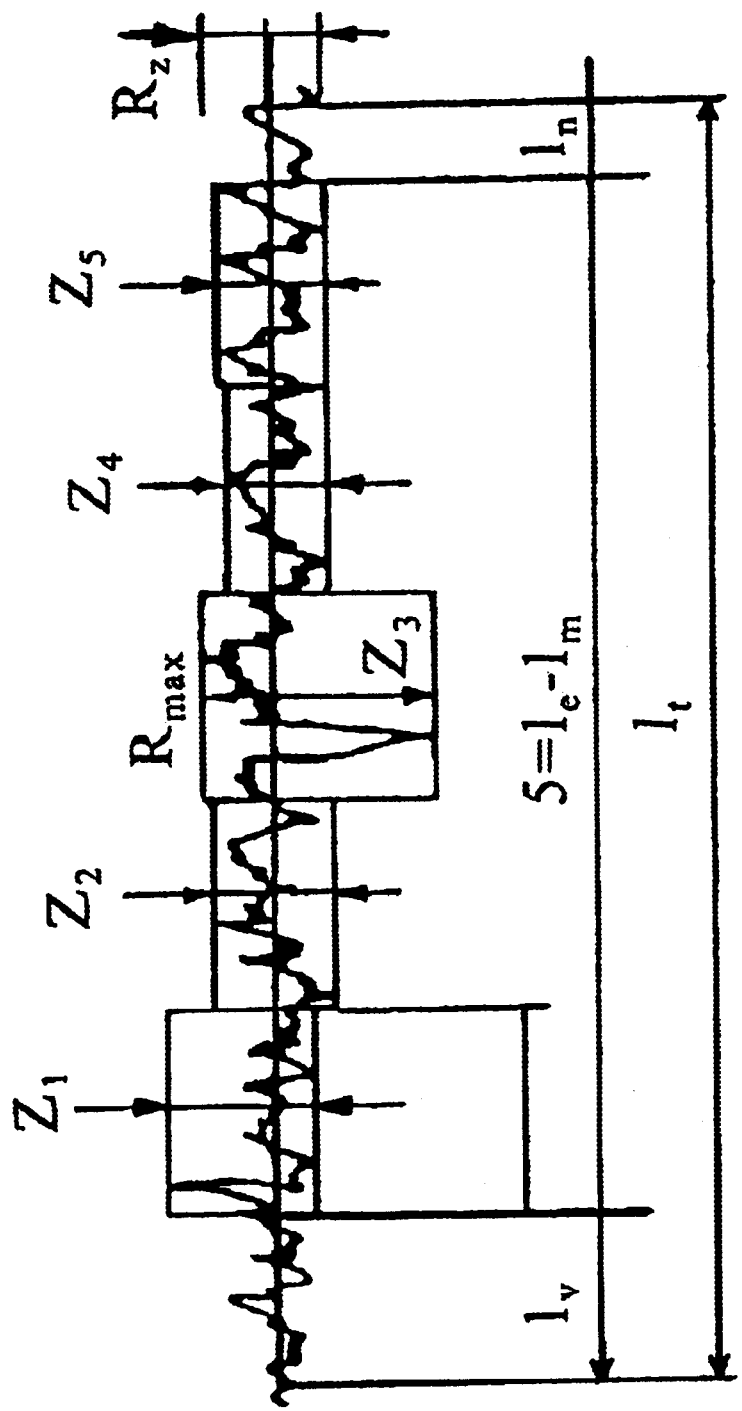
FIG. 3 shows a graph to determine Averaged Depth of Roughness $R_z$, Maximum Depth of Roughness $R_{max}$, and Individual Depth of Roughness $Z_i$ in accordance with DIN 4768.

Individual roughness depth $Z_i$ ($Z_i = Z_1$ to $Z_5$). Distance of two parallels to the center line inside the individual measured section which touch the roughness profile at the highest and at the lowest point (see Figure 3).

Averaged roughness depth $R_z$. Arithmetic average of the individual roughness depths of five individual measured sections adjacent to one another (see Figure 3).

Maximum roughness depth $R_{max}$: Greatest of the individual roughness depths $Z_i$, e.g. $Z_5$ that occur over the entire measured length $I_m$ ) - (see Figure 3).

Center line. Line parallel to the general direction of the roughness profile, the line of the shape of the ideal geometric profile that the sum of the surfaces filled with material above it and of the areas without material below it are equal (See Figure 2).

Lead section $I_v$. Length of the first part of the scanning section not used for evaluation and projected perpendicularly on the center line (See Figure 3).

Total measured length $I_m$. Length projected perpendicularly on the center line of the portion of the roughness profile used for the evaluation (See Figure 3).

Individual measurement section $I_o$: One-fifth of the total measured length $I_m$ (See Figure 3).

Trailing length $I_n$. Length projected perpendicularly on the center line of the final portion of the scanned length and not used for the evaluation (See Figure 3).

Scanned length $I_t$. Total of the lead length $I_v$, total measured length $I_m$ and trailing length $I_n$ (Figure 3). --

UNITED STATES PATENT AND TRADEMARK OFFICE
CERTIFICATE OF CORRECTION

Figure 4:
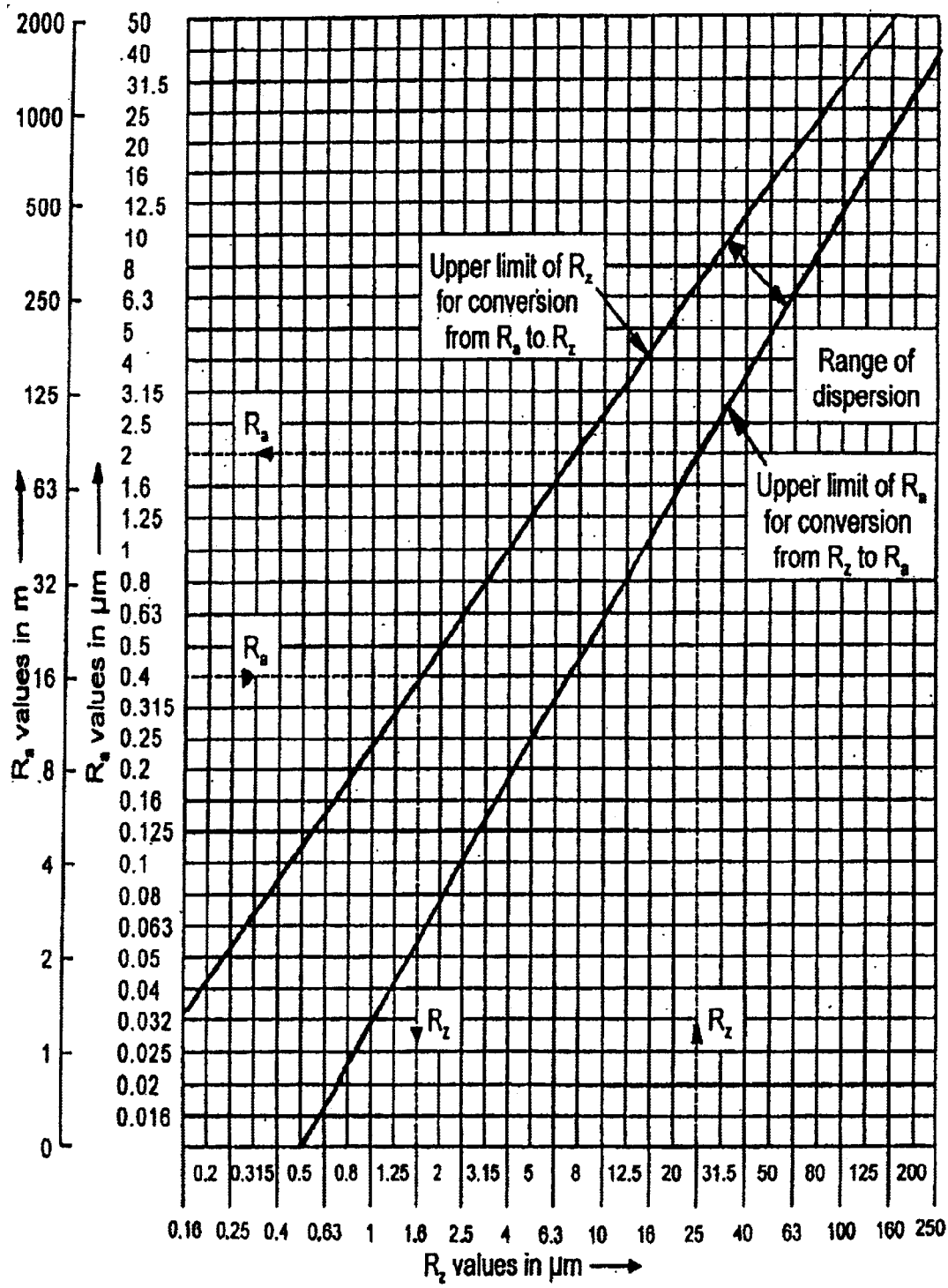
FIG. 4 shows a table for conversion of $R_a$ values into $R_z$ values and vice-versa.

PATENT NO. : 6,688,817 B2
DATED : February 10, 2004
INVENTOR(S) : Bernhard Walter Borschert, Dieter Hermann Mühlfriedel and Karl-Heinz Wendt It is certified that error appears in the above-identified patent and that said Letters Patent is hereby corrected as shown below:

Column 5,
Line 20, after "roughness $R_a$.", insert the following paragraph:
-- A precise conversion between $R_a$ and $R_z$ and vice-versa cannot be justified theoretically or proven empirically. Each conversion is burdened, as a function of the manufacturing methods, with a relatively large scatter. Therefore a diagram was developed (See Figure 4, the boundary lines of which represent the range of dispersion in the determination of the $R_a$ or $R_z$ value with a sufficient safety margin. --
Line 24, after "specified", delete "$R_z$" and insert -- $R_a$ --.

Column 7,
Line 65, after "Dieter" delete "M".
Line 66, before "and", delete "ÜHLFRIEDEL." and insert -- MÜHLFRIEDEL, --.

Column 8,
Line 2, after "Dieter" delete "M".
Line 3, before "and", delete "ÜHLFRIEDEL." and insert -- MÜHLFRIEDEL, --.
Line 22, after "claims from any applied prior art,", insert the following paragraph:
-- The invention as described hereinabove in the context of the preferred embodiments is not to be taken as limited to all of the provided details thereof, since modifications and variations thereof may be made without departing from the spirit and scope of the invention. --.

Column 10,
Line 56, after "second", delete "surfaQe" and insert -- surface --.

Signed and Sealed this

Tenth Day of August, 2004

JON W. DUDAS
*Acting Director of the United States Patent and Trademark Office*